(12) United States Patent
Moon et al.

(10) Patent No.: US 8,637,879 B2
(45) Date of Patent: Jan. 28, 2014

(54) DISPLAY SUBSTRATE, METHOD OF MANUFACTURING A DISPLAY SUBSTRATE AND LIQUID CRYSTAL DISPLAY DEVICE HAVING A DISPLAY SUBSTRATE

(75) Inventors: Joong-Soo Moon, Yongin-si (KR); Dong-Hoon Lee, Yongin-si (KR); Young-Bae Jung, Yongin-si (KR); Eun-Chul Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/325,342

(22) Filed: Dec. 14, 2011

(65) Prior Publication Data

US 2013/0032827 A1 Feb. 7, 2013

(30) Foreign Application Priority Data

Aug. 5, 2011 (KR) .................. 10-2011-0078089

(51) Int. Cl.
*H01L 29/72* (2006.01)
(52) U.S. Cl.
USPC ......... 257/88; 257/E33.053; 438/34; 349/141
(58) Field of Classification Search
USPC ............... 257/88, E33.053; 148/34; 349/141
See application file for complete search history.

(56) References Cited

U.S. PATENT DOCUMENTS

2004/0085278 A1 5/2004 Chae et al.
2009/0040449 A1 2/2009 Jo et al.

FOREIGN PATENT DOCUMENTS

KR 1020040038355 5/2004
KR 1020080112849 12/2008
KR 1020090034137 4/2009

*Primary Examiner* — Edward Wojciechowicz
(74) *Attorney, Agent, or Firm* — Knobbe Martens Olson & Bear LLP

(57) ABSTRACT

A display substrate for a display device includes a substrate, a switching device, a gate line, a data line, a pixel electrode, a plurality of common electrodes. The switching device includes an active pattern, a gate insulation layer, a gate electrode, a source electrode and a drain electrode. The gate line is electrically connected to the source electrode, and the data line is electrically coupled to the gate electrode. The pixel electrode is electrically connected to the drain electrode, and the common electrodes are disposed on the pixel electrode. A coupling capacitance among the common electrodes and the data line can be prevented and/or reduced to prevent a signal delay of the data line. Further, an aperture ratio of the display substrate can be improved by changing a layout of the data line and the gate line.

27 Claims, 6 Drawing Sheets

DISPLAY SUBSTRATE, METHOD OF MANUFACTURING A DISPLAY SUBSTRATE AND LIQUID CRYSTAL DISPLAY DEVICE HAVING A DISPLAY SUBSTRATE

CROSS-REFERENCE TO RELATED APPLICATIONS

This application claims priority under 35 U.S.C. §119 to Korean patent Application No. 10-2011-0078089, filed on Aug. 5, 2011, the disclosure of which is hereby incorporated by reference herein in its entirety.

BACKGROUND

1. Field

Embodiments of the invention relate to display substrates having improved wiring structures, methods of manufacturing display substrates having improved wiring structures and liquid crystal display devices having display substrates including improved wiring structures.

2. Description of the Related Technology

A liquid crystal display device can include a thin film transistor array substrate including a pixel electrode, a color filter substrate including a common electrode and a liquid crystal layer disposed therebetween. The liquid crystal display device can display images by controlling a transmittance of light according to an orientation of liquid crystal molecules in the liquid crystal layer by varying an electric field generated between the pixel electrode and the common electrode. Recently, in order to increase a lateral visibility, a liquid crystal display device having a patterned vertical alignment (PVA) mode or an in-plane switching (IPS) mode has been developed. However, the liquid crystal display device having the PVA mode can have some disadvantages such as an afterimage problem or a limitation in increasing the lateral visibility. The liquid crystal display device having the IPS mode can have a disadvantage such as a low brightness.

Considering the above described problems, for example, as disclosed in Korean patent Application No. 10-2010-0103010, a liquid crystal display device having a plane to line switching (PLS) mode has been developed to increase the lateral visibility and the brightness. The liquid crystal display device having a conventional PLS mode can include a thick organic insulation layer between the data line and the common electrode, so that an undesirable coupling capacitance between a gate signal and a data signal can be reduced to implement a stable pixel charge. However, in the liquid crystal display device having the conventional PLS mode, the organic insulation layer can be damaged during subsequent processes performed at a relatively high temperature of about 400° C., so that a coupling capacitance between the common electrode and the data line can occur and an additional contact be needed to connect the pixel electrode to the thin film transistor.

SUMMARY OF CERTAIN INVENTIVE ASPECTS

Some embodiments provide display substrates preventing or reducing a coupling capacitance between a data line and a common electrode through an improved wiring structure such as a gate line, a data line and electrodes, thereby preventing a signal delay and increasing an aperture ratio.

Some embodiments provide methods of manufacturing display substrates preventing or reducing a coupling capacitance between a data line and a common electrode through an improved wiring structure, thereby preventing a signal delay and increasing an aperture ratio.

Some embodiments provide liquid crystal display devices including display substrates that can prevent or reduce a coupling capacitance between a data line and a common electrode through an improved wiring structure, thereby preventing a signal delay and increasing an aperture ratio.

According to one aspect, there is provided a display substrate including a substrate, a switching device, a gate line, a data line, a pixel electrode and a plurality of common electrodes. The switching device can include an active pattern, a gate insulation layer, a gate electrode, a source electrode and a drain electrode on the substrate. The active pattern can have a first impurity region, a channel region and a second impurity region. The gate line can be electrically connected to the source electrode. The data line can be electrically connected to the gate electrode. The pixel electrode can be electrically coupled to the drain electrode. The common electrodes can be disposed over the pixel electrode.

The gate insulation layer can cover the active pattern, and the gate line can be located on the gate insulation layer.

The display device can further include an insulation layer on the gate insulation layer to cover the gate line and the gate electrode.

The source electrode can extend on the insulation layer from the impurity region to the gate line.

A first portion of the source electrode can be electrically connected to the first impurity region, and a second portion of the source electrode cancan be electrically coupled to the gate line.

The first portion of the source electrode can pass through the insulation layer and the gate insulation layer to make contact with a first contact disposed on the first impurity region, and the second portion of the source electrode can pass through the insulation layer to make contact with a second contact on the gate line.

The source electrode can be formed integrally with the first contact and the second contact.

A first portion of the drain electrode can electrically contact the second impurity region, a second portion of the drain electrode can extend on the insulation layer, and the pixel electrode can electrically contact the second portion of the drain electrode.

The drain electrode can pass through the insulation layer and the gate insulation layer to make contact with a third contact disposed on the second impurity region.

The data line can pass through the insulation layer to make contact with a fourth contact disposed on the gate electrode.

The data line can be formed integrally with the fourth contact.

The switching device can be disposed in a central portion of a pixel region of the display substrate, and the data line can be disposed adjacent to the central portion of the pixel region.

The switching device can be disposed at peripheral portions of adjacent pixel regions, and the data line can be disposed between adjacent pixel regions.

The common electrodes can include a plurality of first common electrodes and a plurality of second electrodes. The first common electrodes and the second common electrodes can be separated from one another centering the switching device.

Distances between the first common electrodes and the second common electrodes can be larger than distance between adjacent first common electrodes or adjacent second common electrodes.

According to another aspect, there is provided a method of manufacturing a display substrate. In the method, an active pattern on a substrate including a first impurity region, a channel region and a second impurity region can be formed on a substrate. A gate insulation layer can be formed on the substrate to cover the active pattern. A gate line and a gate electrode can be formed on the gate insulation layer. A first insulation layer can be formed on the gate insulation layer to cover the gate line and the gate electrode. A source electrode, a data line and a drain electrode can be formed on the first insulation layer. The source electrode can be electrically connected to the gate line. The data line can be electrically connected to the gate electrode. The drain electrode can be electrically connected to the second impurity region. A second insulating layer can be formed on the first insulation layer to cover the source electrode, the data line and the drain electrode. A pixel electrode can be formed on the second insulation layer. The pixel electrode can be electrically connected to the drain electrode.

In a formation of the source electrode, the data line and the drain electrode, the first insulation layer and the gate insulation layer can be partially removed to form a first contact hole exposing the first impurity region, to form a second contact hole exposing the gate line, to form a third contact hole exposing the second impurity region and to form a fourth contact hole exposing the gate electrode. A first conductive layer can be formed on the first insulation layer to fill the first contact hole, the second contact hole, the third contact hole and the fourth contact hole. The first conductive layer can be patterned to form a first contact, a second contact, a third contact and a fourth contact in the first contact hole, the second contact hole, the third contact hole and the fourth contact hole, respectively, and to form the source electrode, the data line and the drain electrode on the first insulation layer.

The source electrode, the first contact and the second contact can be formed simultaneously, the drain electrode and the third contact can be formed simultaneously, and the data line and the fourth contact can be formed simultaneously.

Forming the active pattern can further include forming a first electrode of a storage capacitor on the gate insulation layer, and forming the gate line and the gate electrode can further include forming a second electrode of the storage capacitor on the gate insulation layer.

Each of the first and the second insulation layers can be formed using silicon compound.

In a formation of the pixel electrode, the second insulation layer can be partially removed to form a fifth contact hole exposing the drain electrode. A second conductive layer can be formed on the second insulation layer to fill the fifth contact hole. The second conductive layer can be patterned to form a fifth contact in the fifth contact hole and to form the pixel electrode on the second insulation layer.

A third insulation layer can be formed on the second insulation layer to cover the pixel electrode. A plurality of first common electrodes and a plurality of second common electrodes can be formed on the third insulation layer. The first and the second common electrodes can correspond to the pixel electrode.

According to another aspect, there is provided a liquid crystal display device including a first substrate, a switching device, a gate line, a data line, a pixel electrode, a plurality of common electrodes, a liquid crystal layer, a reference electrode and a second substrate. The switching device can include an active pattern, a gate insulation layer, a gate electrode, a source electrode and a drain electrode on the substrate. The active pattern can have a first impurity region, a channel region and a second impurity region. The gate line can be electrically connected to the source electrode. The data line can be electrically connected to the gate electrode. The pixel electrode can be electrically connected to the drain electrode. The common electrodes can be disposed on the pixel electrode. The liquid crystal layer can be disposed on the common electrodes. The reference electrode can be disposed on the liquid crystal layer. The second substrate can be disposed on the reference electrode.

The liquid crystal display device can further comprise an insulation layer disposed on the gate insulation layer. The insulation layer can cover the gate line and the gate electrode.

The source electrode on the insulation layer can extend from the impurity region to the gate line. A first portion of the source electrode can be electrically connected to the first impurity region, and a second portion of the source electrode can be electrically connected to the gate line.

The first portion of the source electrode can pass through the insulation layer and the gate insulation layer to make contact with a first contact on the first impurity region, the second portion of the source electrode can pass through the insulation layer to make contact with a second contact on the gate line, and the data line can pass through the insulation layer to make contact with a fourth contact on the gate electrode.

The switching device can be disposed in a central portion of a pixel region or peripheral portions of adjacent pixel regions, and the data line can be disposed adjacent to the central portion or between adjacent pixel regions.

BRIEF DESCRIPTION OF THE DRAWINGS

Certain embodiments can be understood in more detail from the following description taken in conjunction with the accompanying drawings, in which.

DETAILED DESCRIPTION OF CERTAIN INVENTIVE EMBODIMENTS

Figure 1:
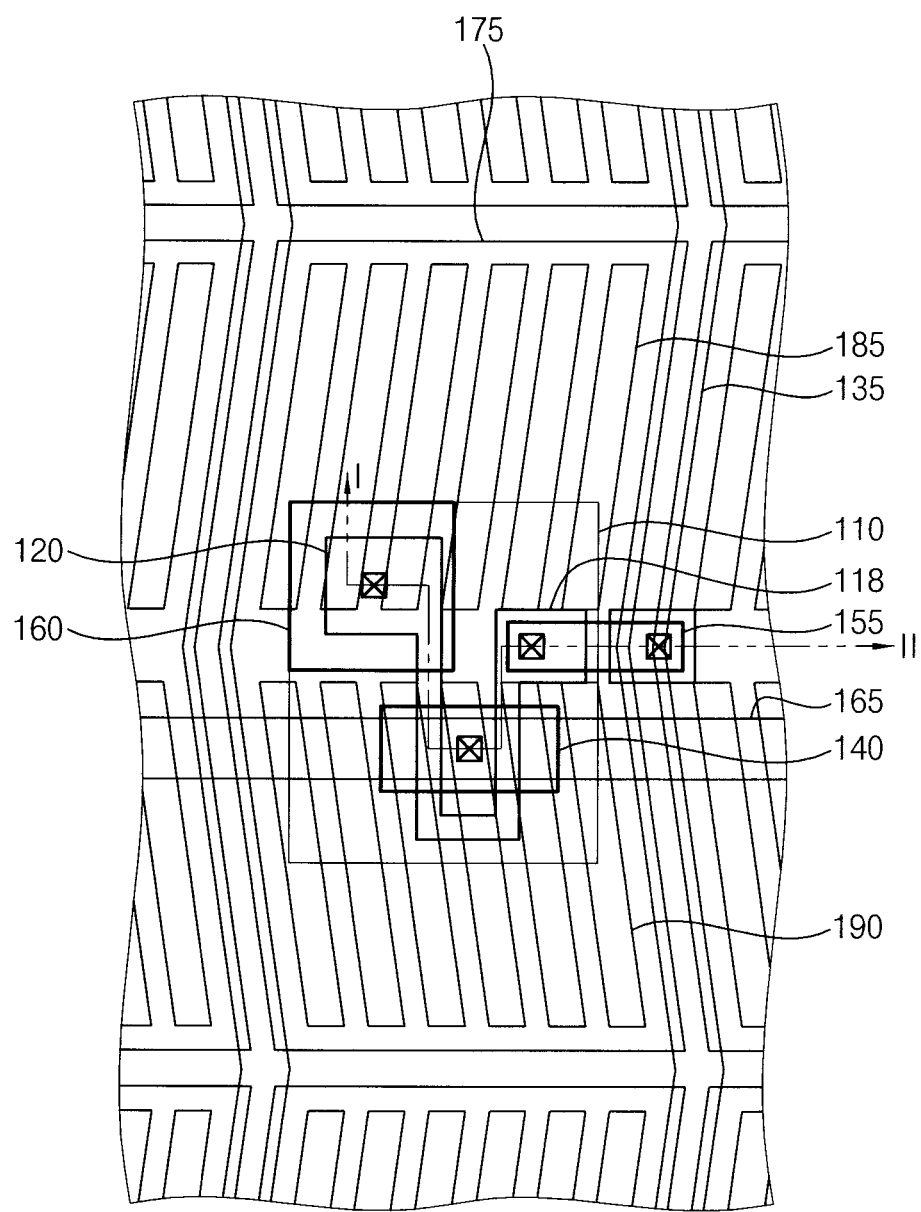
FIG. 1 is a plan view illustrating an embodiment of a display substrate.

Various embodiments will be described more fully hereinafter with reference to the accompanying drawings, in which some embodiments are shown. The invention can, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals generally refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Certain embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
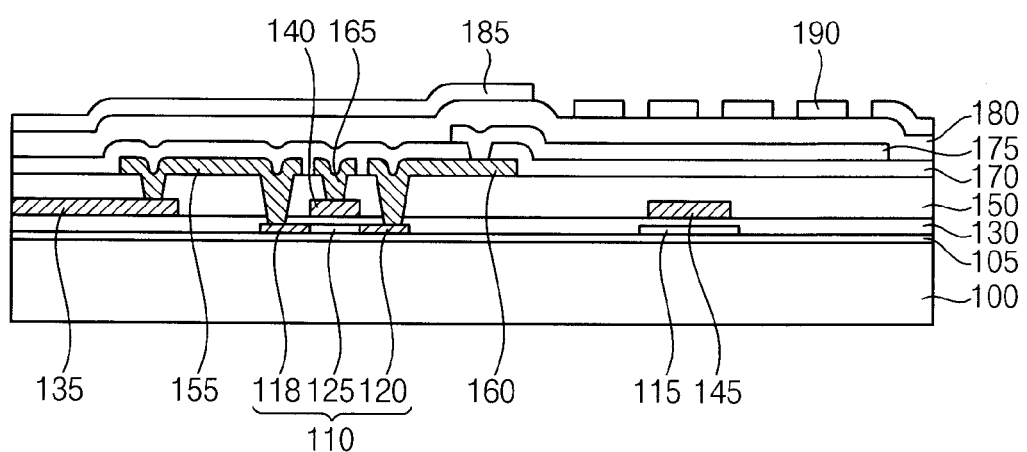
FIG. 2 is a cross sectional view illustrating an embodiment of a display substrate.

FIG. 1 is a plan view illustrating an embodiment of a display substrate, and FIG. 2 is a cross sectional view illustrating an embodiment of a display substrate. For example, the display substrate illustrated in FIG. 2 can be obtained by taking the display substrate along a line I-II in FIG. 1.

Referring to FIG. 1 and FIG. 2, the display substrate can include a first substrate 100, a switching device, a storage capacitor, a gate line 135, a data line 165, a plurality of insulation layers 150, 170 and 180, a pixel electrode 175, first and second common electrodes 185 and 190. In some embodiments, the plurality of insulation layers 150, 170 and 180 can include inorganic materials such as silicon compounds. For example, the display substrate may not include an organic insulation layer whereas the conventional display substrate includes at least one organic insulation layer.

The first substrate 100 can include a transparent insulation material. For example, the first substrate 100 can include a glass substrate, a quartz substrate, a transparent resin substrate, a transparent ceramic substrate, etc.

A buffer layer 105 can be disposed on the first substrate 100. The buffer layer 105 can prevent diffusions of metal atoms and/or impurities from the first substrate 100 in successive processes of forming the display substrate. Additionally, the buffer layer 105 can improve a flatness of an upper surface of the substrate 100 when the upper surface of the substrate 100 may be irregular. The buffer layer 105 can have a relatively large thickness. For example, the buffer layer 105 can have a thickness of about 1,000 Å to about 3,000 Å based on an upper face of the first substrate 100. The buffer layer 105 can include a silicon compound. For example, the buffer layer 105 can include silicon oxide (SiOx), silicon nitride (SiNx), silicon oxynitride (SiOxNy), silicon oxycarbide (SiOxCy), silicon carbon nitride (SiCxNy), and the like. These can be used alone or in a combination thereof. The buffer layer 105 can have a single layer structure or a multi layer structure including the silicon compound. In some embodiments, the buffer layer 105 may not be disposed on the first substrate 100 depending on a material in the first substrate 100 and/or conditions of the upper surface of the first substrate 100.

The switching device and the storage capacitor can be disposed on the first substrate 100 or the buffer layer 105. The switching device can be spaced apart from the storage capacitor by a predetermined distance. The switching device can include an active pattern 110, a gate insulation layer 130, a gate electrode 140, a source electrode 155, and a drain electrode 160. The storage capacitor can include a first electrode 115, the gate insulation layer 130, and a second electrode 145.

In some embodiments, the switching device can be positioned in a central portion in a pixel region of the display substrate. In such embodiments, the switching device can include a thin film transistor (TFT). The active pattern 110 of the switching device can be located on the first substrate 100 or the buffer layer 105. The first electrode 115 of the storage capacitor can be disposed on the first substrate 100 or the buffer layer 105 wherein the first electrode 115 can be separated from the active pattern 110 by a predetermined distance.

The active pattern 110 of the switching device can include a first impurity region 118, a second impurity region 120 and a channel region 125. The active pattern 110 can include silicon. For example, the channel region 125 of the active pattern 110 can include polysilicon, amorphous silicon, partially crystallized silicon, micro crystalline silicon, and the like. The first and the second impurity regions 118 and 120 can include polysilicon, amorphous silicon, partially crystallized silicon, micro crystalline silicon, which can be doped with n-type impurities or p-type impurities. The first and the second impurity regions 118 and 120 can correspond to a source region and a drain region of the transistor, respectively. The first electrode 115 of the storage capacitor can also include silicon. For example, the first electrode 115 can include polysilicon, amorphous silicon, partially crystallized silicon, micro crystalline silicon, and the like. In some embodiments, the first electrode 115 can include a material substantially the same as or substantially similar to that of the active pattern 110. In other embodiments, the first electrode 115 can include a material different from that of the active pattern 110. Each of the active pattern 110 and the first electrode 115 can have a relatively small thickness. For example, each of the active pattern 110 and the first electrode 115 can have a thickness of about 300 Å to about 700 Å.

The gate insulation layer 130 covering the active pattern 110 and the first electrode 115 can be disposed on the buffer layer 105 or the first substrate 100. The gate insulation layer 130 can include silicon compound, metal oxide, and the like. For example, the gate insulation layer 130 can include silicon oxide, hafnium oxide (HfOx), aluminum oxide (AlOx), titanium oxide (TiOx), zirconium oxide (ZrOx), tantalum oxide (TaOx), and the like. These can be used alone or in a combination thereof. The gate insulation layer 130 can have a relatively small thickness. For example, the gate insulation layer 130 can have a thickness of about 500 Å to about 1500 Å. In some embodiments, the gate insulation layer 130 can sufficiently cover the active pattern 110 and the first electrode 115, and can have a substantially level surface. In other embodiments, the gate insulation layer 130 can have stepped portions caused by profiles of the active pattern 110 and/or the first electrode 115.

In some embodiments, the gate line 135 can be electrically connected to the source electrode 115 of the switching device, and the data line 165 can be electrically connected to the gate electrode 140 of the switching device. For example, the gate line 135 and the data line 165 can be respectively coupled to the source electrode 115 and the gate electrode 140 in the pixel region of the display substrate. Further, gate electrodes and source electrodes of transistors can be respectively coupled to the gate line 140 and the data line 165 in a peripheral region of the display substrate. Therefore, a coupling capacitance among first common electrodes 185, second common electrodes 190 and the data line 165 can be considerably reduced to thereby prevent a signal delay of the data line 165. Further, a layout of the data line 165 and the gate line 135 can be modified to improve an aperture ratio of the display substrate.

As illustrated in FIG. 1, the gate line 135 can extend on the gate insulation layer 130 along a first direction. A central portion of the gate line 135 can be bent at a predetermined angle in the pixel region of the display substrate adjacent to the switching device. The data line 165 can extend along a second direction substantially perpendicular to the first direction on a first insulation layer 150 which can substantially cover the gate line 135. The data line 165 can be positioned adjacent to a bent portion of the gate line 135. The gate line 135 can be disposed on the gate insulation layer 130 adjacent to the active pattern 110. The data line 165 can be located on the first insulation layer 150 under which the gate electrode 140 can be disposed.

The gate line 135, the gate electrode 140 of the switching device and the second electrode 145 of the storage capacitor can be disposed on the gate insulation layer 130. The gate line 135 and the second electrode 145 can be located on the gate insulation layer 130 to be separated from each other centering the gate electrode 140. Each of the gate line 135, the gate electrode 140 and the second electrode 145 can have a relatively large thickness. For example, each of the gate line 135, the gate electrode 140 and the second electrode 145 can have a thickness in a range of about 2,000 Å to about 4,000 Å. Further, each of the gate line 135, the gate electrode 140 and the second electrode 145 can include metal, alloy, metal nitride, conductive metal oxide, a transparent conductive material, and the like. For example, each of the gate line 135, the gate electrode 140 and the second electrode 145 can include molybdenum (Mo), alloy containing molybdenum, aluminum (Al), alloy containing aluminum, aluminum nitride (AlNx), silver (Ag), alloy containing silver, tungsten (W), tungsten nitride (WNx), copper (Cu), alloy containing copper, nickel (Ni), chromium (Cr), chromium nitride (CrNx), titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), and the like. These can be used alone or in a combination thereof. In some embodiments, the gate line 135, the gate electrode 140 and the second electrode 145 can include substantially the same material. In other embodiments, the gate line 135, the gate electrode 140 and the second electrode 145 can include different materials, respectively.

The first insulation layer 150 covering the gate line 135, the gate electrode 140 and the second electrode 145 can be disposed on the gate insulation layer 130. The first insulation layer 150 can have a relatively large thickness. For example, the first insulation layer 150 can have a thickness of about 5,000 Å to about 10,000 Å based on an upper face of the gate insulation layer 130. The first insulation layer 150 can include silicon compound. For example, the first insulation layer 150 can include silicon oxide, silicon nitride, silicon oxynitride, silicon oxycarbide, silicon carbon nitride, and the like. These can be used alone or in a combination thereof.

In some embodiments, the first insulation layer 150 can have a multi layer structure including a silicon oxide layer and a silicon nitride layer. In such embodiments, the silicon oxide layer can have a thickness of about 1,000 Å to about 2,000 Å, and the silicon nitride layer can have a thickness of about 4,000 Å to about 8,000 Å. Further, the first insulation layer 150 can have a substantially level surface. For example, the upper surface of the first insulation layer 150 can be planarized by performing a planarization process about the first insulation layer 150.

The source electrode 155, the drain electrode 160 and the data line 165 can be disposed on the first insulation layer 150. Each of the source electrode 155, the drain electrode 160 and the data line 165 can include metal, alloy, metal nitride, conductive metal oxide, a transparent conductive material, and the like. For example, each of the source electrode 155, the drain electrode 160 and the data line 165 can include molybdenum (Mo), alloy containing molybdenum, aluminum (Al), alloy containing aluminum, aluminum nitride (AlNx), silver (Ag), alloy containing silver, tungsten (W), tungsten nitride (WNx), copper (Cu), alloy containing copper, nickel (Ni), chromium (Cr), chromium nitride (CrNx), titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), and the like. These can be used alone or in a combination thereof. In some embodiments, the source electrode 155, the drain electrode 160 and the data line 165 can include substantially the same material. In other embodiments, the source electrode 155, the drain electrode 160 and the data line 165 can include different materials, respectively. Each of the source electrode 155, the drain electrode 160 and the data line 165 can have a relatively large thickness. For example, each of the source electrode 155, the drain electrode 160 and the data line 165 can have a thickness in a range of about 2,000 Å to about 4,000 Å.

In some embodiments, the source electrode 155 can extend from a first portion of the first insulation layer 150 under which the first impurity region 118 may be located to a second portion of the first insulation layer 150 under which the gate line 135 may be positioned. In such embodiments, a first portion of the source electrode 155 can be electrically connected to the first impurity region 118 of the active pattern 110 through a first contact, and a second portion of the source electrode 155 can be electrically connected to the gate line 135 through a second contact. For example, the first portion of the source electrode 155 can penetrate the first insulation layer 150 and the gate insulation layer 130 to be located on the first contact disposed on the first impurity region 118. The second portion of the source electrode 155 can pass through the first insulation layer 150 to be located on the second contact disposed on the gate line 135. In some embodiments, the source electrode 155 can be formed integrally with the first contact and the second contact. In other embodiments, the source electrode 155 can directly contact the first impurity region 118 and the gate line 135 without formation of the first and the second contacts.

A first portion of the drain electrode 160 can be electrically connected to the second impurity region 120 through a third contact. For example, the first portion of the drain electrode 160 can pass through the first insulation layer 150 and the gate insulation layer 130 to be located on the third contact disposed on the second impurity region 120. In some embodiments, the first portion of the drain electrode 160 and the third contact can be formed integrally. In other embodiments, the first portion of the drain electrode 160 can make direct contact with the second impurity region 120 without the third contact. A second portion of the drain electrode 160 can be disposed on the first insulation layer 150 to substantially extend along a direction to the storage capacitor.

The data line 165 can be electrically coupled to the gate electrode 140 of the switching device through a fourth contact. For example, the data line 165 can penetrate the first insulation layer 150 to be located on the fourth contact disposed on the gate electrode 140. In some embodiments, the data line 165 can be formed integrally with the fourth contact. In other embodiments, the data line 165 can directly contact the gate electrode 140 without the fourth contact. As described above, the data line 165 can extend along a second direction substantially perpendicular to the first direction. When the switching device is positioned in the central portion of the pixel region of the display substrate, the data line 165 can be located adjacent to the central portion of the pixel region to substantially cross the pixel region. For example, the data line 165 crossing the pixel region can be positioned adjacent to the bent portion of the gate line 135.

The second insulation layer 170 covering the source electrode 155, the data line 165 and the drain electrode 160 can be disposed on the first insulation layer 150. The second insulation layer 170 can include silicon compound such as silicon oxide, silicon nitride, silicon oxynitride, silicon oxycarbide, silicon carbon nitride, and the like. The second insulation layer 170 can have a relatively large thickness. For example, the second insulation layer 170 can have a thickness in a range of about 1,000 Å to about 3,000 Å. In some embodiments, the second insulation layer 170 can have a uniform thickness along profiles of the source electrode 155, the data line 165 and the drain electrode 160. Therefore, the second insulation layer 170 can have stepped portions adjacent to the source electrode 155, the data line 165 and the drain electrode 160.

The pixel electrode 175 can be disposed on the second insulation layer 170, and can be electrically connected to the drain electrode 160. For example, the pixel electrode 175 can pass through the second insulation layer 170 to be located on a fifth contact on the drain electrode 160. In some embodiments, the pixel electrode 175 can be formed integrally with the fifth contact. In other embodiments, the pixel electrode 175 can make direct contact with the drain electrode 160 without the fifth contact. The pixel electrode 175 can include a transparent conductive material. For example, the pixel electrode 175 can include zinc oxide, indium tin oxide, tin oxide, indium oxide, gallium oxide, indium zinc oxide, and the like. These can be used alone or in a combination thereof.

As illustrated in FIG. 1, the pixel electrode 175 can substantially cover the pixel region of the display substrate. In some embodiments, the pixel electrode 175 can have a central portion that can be bent at a predetermined angle substantially similar to that of the gate line 135. The pixel electrode 175 can have a relatively small thickness. For example, the pixel electrode 175 can have a thickness in a range of about 350 Å to about 550 Å.

The third insulation layer 180 covering the pixel electrode 175 can be disposed on the second insulation layer 170. The third insulation layer 180 can have a relatively large thickness. For example, the third insulation layer 180 can have a thickness of about 1,000 Å to about 3,000 Å measured from an upper face of the second insulation layer 170. Further, the third insulation layer 180 can include silicon compound. For example, the third insulation layer 180 can include silicon oxide, silicon nitride, silicon oxynitride, silicon oxycarbide, silicon carbon nitride, and the like. In some embodiments, the third insulation layer 180 can have a uniform thickness along profiles of the second insulation layer 170, so that the third insulation layer 180 can have stepped portion caused by a profile of the pixel electrode 175.

As illustrated in FIG. 1, the first and the second common electrodes 185 and 190 substantially opposing the pixel electrode 175 can be disposed on the third insulation layer 180. Each of the first and the second common electrodes 185 and 190 can include a transparent conductive material. For example, each of the first and the second common electrodes 185 and 190 can include zinc oxide, indium tin oxide, tin oxide, indium oxide, gallium oxide, indium zinc oxide, and the like. These can be used alone or in a combination thereof. Further, each of the first and the second common electrodes 185 and 190 can a relatively small thickness. For example, the first and the second common electrodes 185 and 190 can have thicknesses of about 350 Å to about 550 Å.

In some embodiments, the display substrate can include a plurality of first common electrodes 185 and a plurality of second common electrodes 190, which can be spaced apart from one another centering the central portion of the pixel region. For example, the first common electrodes 185 can be separated from the second common electrodes 190 by first distances centering the bent portion of the gate line 135. Adjacent first common electrodes 185 can be separated from one another by second distances, and adjacent second common electrodes 190 can be spaced apart from one another by third distances. In such embodiments, the first distances can be substantially larger than the second distances and the third distances, and the second distances can be substantially same as or substantially similar to the third distances. The first and the second common electrodes 180 and 190 can be disposed on the third insulation layer 180 to extend along a direction that can be substantially similar to that of the gate line 135.

Figure 3:
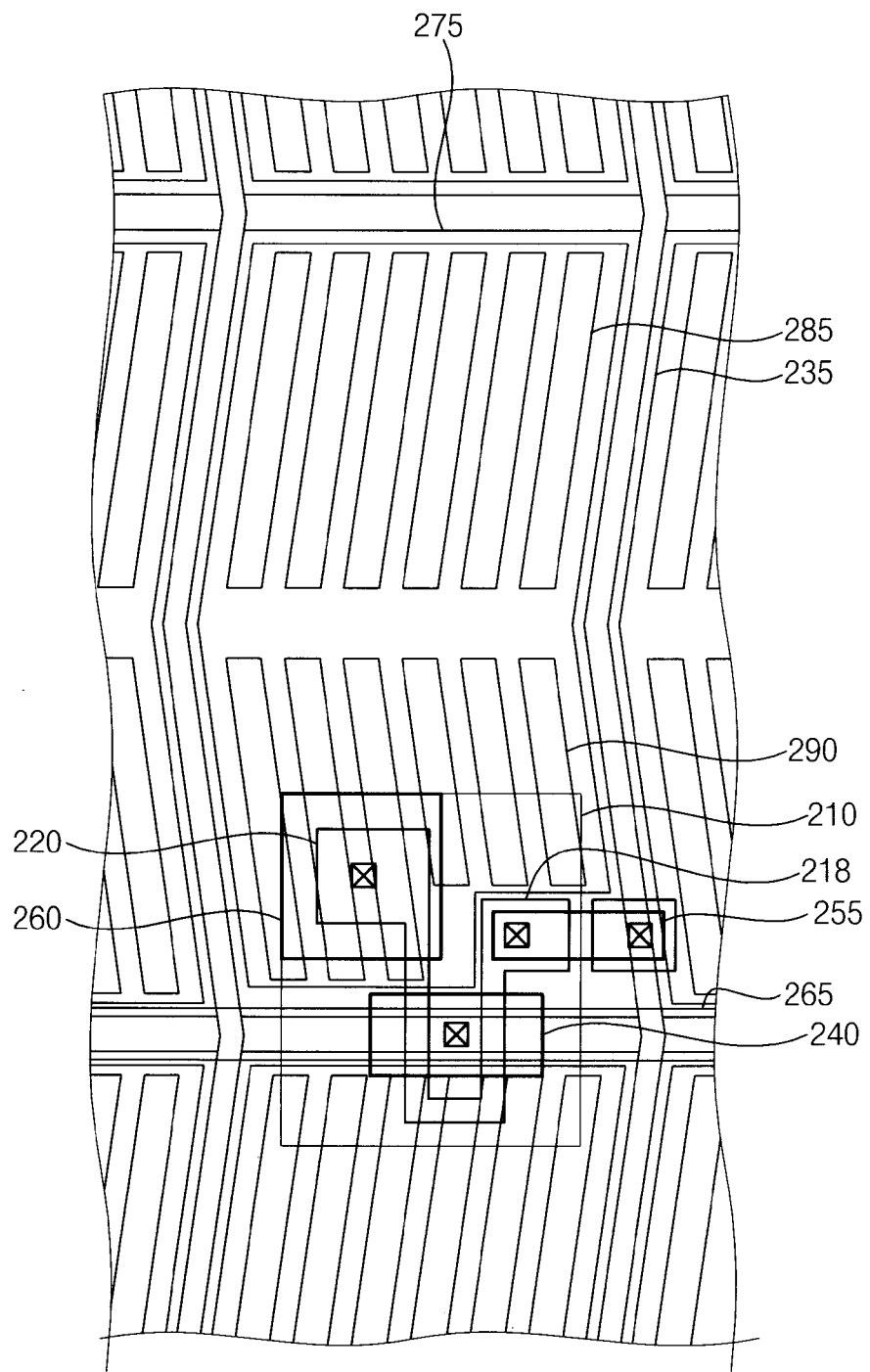
FIG. 3 is a plan view illustrating an embodiment of a display substrate.

FIG. 3 is a plan view illustrating an embodiment of a display substrate. The display substrate illustrated in FIG. 3 can have a construction substantially the same as or substantially similar to that of the display substrate described with reference to FIGS. 1 and 2 except for a switching device, a layout of a data line and a shape of a pixel electrode.

Referring to FIG. 3, the display substrate can include a switching device, a gate line 235, a data line 265, a pixel electrode 275, first and second common electrodes 285 and 290, and a storage capacitor (not illustrated).

In some embodiments, the switching device can be positioned at peripheral portions of adjacent pixel regions, and the data line 265 can be positioned between the adjacent pixel regions. For example, the switching device can extend from a peripheral portion of one pixel region to a peripheral portion of adjacent pixel region. Adjacent pixel regions can share the switching device.

The switching device can be provided on a first substrate (not illustrated). The switching device can include an active pattern 210, a gate electrode 240, and a drain electrode 260. In such embodiments, the active pattern 210 can include a first impurity region 218, a second impurity region 220 and a channel region.

As illustrated in FIG. 3, the gate line 235 can be electrically connected to the source electrode 255 through a first contact, and the source electrode 255 can be electrically connected to the first impurity region through a second contact. In some embodiments, the gate electrode 235 and the source electrode 255 can be respectively coupled to the source electrode 255 and the first impurity region without the first and the second contacts. The gate line 235 can be bent primarily in a central portion of the pixel region of the display substrate, and can be bent secondarily between the adjacent pixel regions.

The pixel electrode 275 can be electrically connected to the drain electrode 260 through a third contact. In some embodiments, the pixel electrode 275 can make direct contact with the drain electrode 260 without the third contact. The pixel electrode 275 can substantially cover the pixel region of the display substrate. The pixel electrode 275 may not be located over the source electrode 255 of the switching device. For example, the pixel electrode 275 can be opened above the source electrode 255, so that the pixel electrode 275 may not be positioned on a second insulation layer (not illustrated) where the source electrode 255 can be located. Additionally, the data line 265 can be electrically coupled to the gate electrode 240 through a fourth contact. However, the data line 265 can be connected to the gate electrode 240 without the fourth contact. A first insulation layer (not illustrated) can be disposed between the data line 265 and the gate line 235, so that the data line 265 can be positioned between adjacent pixel regions over a bent portion of the gate line 235. For example, the data line 265 can cross between adjacent pixel regions of the display substrate.

In some embodiments, the switching device can be disposed between the adjacent pixel regions, so that the pixel electrode 275 and/or the first and the second common electrodes 285 and 290 may not substantially overlap relative to the data line 265. Therefore, a coupling capacitance among the data line 265 and the first and the second common electrodes 285 and 290 can be prevented and/or considerably reduced. Further, the pixel electrode 275 may not be disposed on the source electrode 255 of the switching device, so that the source electrode 255 may not be electrically connected to the pixel electrode 275 without formation of an additional insulation layer between the source electrode 255 and the pixel electrode 275.

FIGS. 4 to 7 are cross sectional views illustrating an embodiment of a method of manufacturing a display substrate. The display substrate obtained by the method illustrated in FIGS. 4 to 7 can have a construction substantially the same as or substantially similar to that of the display substrate described with reference to FIG. 2. However, the method can be properly and easily modified by those with ordinary skill in the art to manufacture the display substrate described with reference to FIG. 3.

Figure 4:
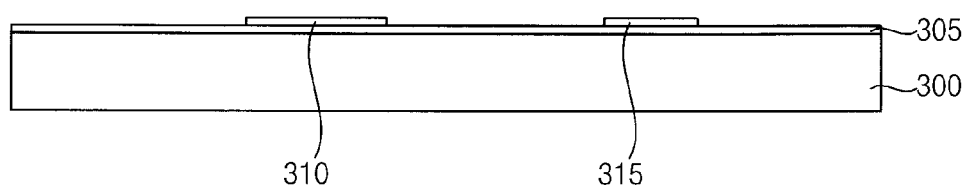
FIGS. 4 to 7 are cross sectional views illustrating an embodiment of a method of manufacturing a display substrate.

Referring to FIG. 4, a buffer layer 305 can be formed on a first substrate 300. The first substrate 300 can include a transparent insulation material. For example, the first substrate 300 can be formed using glass, quartz, transparent resin, transparent ceramic, and the like.

The buffer layer 305 can be formed using silicon compound such as silicon oxide, silicon nitride, silicon oxynitride, silicon oxycarbide, silicon carbon nitride, and the like. Further, the buffer layer 305 can be formed on the first substrate 300 by a chemical vapor deposition (CVD) process, a plasma enhanced chemical vapor deposition (PECVD) process, a high density plasma-chemical vapor deposition (HDP-CVD) process, a spin coating process, and the like. In some embodiments, the buffer layer 305 can have a single layer structure or a multi layer structure including at least one silicon compound layer. In other embodiments, the buffer layer 305 may not be formed on the first substrate 300 in accordance with a material in the first substrate 300 and/or conditions of an upper surface of the first substrate 300.

A semiconductor pattern 310 and a first electrode 315 can be formed on the buffer layer 305. The semiconductor pattern 310 can be separated from the first electrode 315 by a predetermined distance. In some embodiments, a semiconductor layer (not illustrated) can be formed on the buffer layer 305, and the semiconductor layer can be patterned by a photolithography process or an etching process using an additional etching mask to thereby form a preliminary semiconductor pattern (not illustrated) and a preliminary first electrode (not illustrated) on the buffer layer 305. In such embodiments, the semiconductor layer can be formed using amorphous silicon, amorphous silicon doped with impurities, and the like. Further, the semiconductor layer can be formed by a chemical vapor deposition process, a plasma enhanced chemical vapor deposition process, a high density plasma-chemical vapor deposition process, a sputtering process, and the like. A crystallization process can be performed about the preliminary semiconductor pattern and the preliminary first electrode, so that the semiconductor pattern 310 and the first electrode 315 can be provided on the buffer layer 305. The crystallization process can include a laser irradiation process, a heat treatment process, a heat treatment process using a catalyst, and the like. Here, each of the semiconductor pattern 310 and the first electrode 315 can include polysilicon, polysilicon doped with impurities, partially crystallized silicon, micro crystalline silicon, and the like.

In some embodiments, the semiconductor layer and/or the preliminary semiconductor pattern and the preliminary first electrode can be formed on the buffer layer 305, and a dehydrogenation process can be performed about the semiconductor layer and/or the preliminary semiconductor pattern and the preliminary first electrode. Therefore, a hydrogen concentration in the semiconductor layer and/or in the preliminary semiconductor pattern and in the preliminary first electrode can be reduced to improve electrical characteristics of the semiconductor pattern 310 and the first electrode 315.

Figure 5:
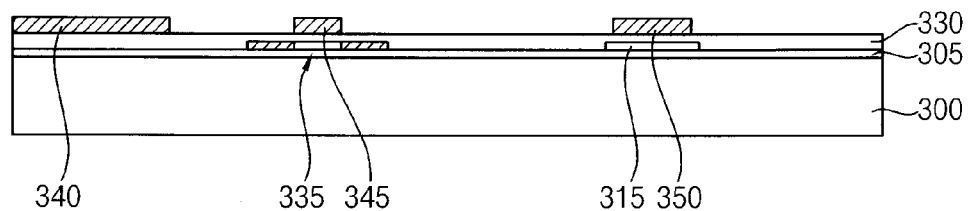

Referring to FIG. 5, a gate insulation layer 330 can be formed on the buffer layer 305 to cover the semiconductor pattern 310 and the first electrode 315. The gate insulation layer 330 can be formed using silicon compound, metal oxide, and the like. Further, the gate insulation layer 330 can be formed on the buffer layer 305 by a chemical vapor deposition process, a spin coating process, a plasma enhanced chemical vapor deposition process, a sputtering process, an vacuum evaporation process, a high density plasma-chemical vapor deposition process, a printing process, and the like. In some embodiments, the gate insulation layer 330 can sufficiently cover the semiconductor pattern 310 and the first electrode 315, and the gate insulation layer 330 can have a substantially level surface.

A gate line 340, a gate electrode 345 and a second electrode 350 can be formed on the gate insulation layer 330. Each of the gate line 340, the gate electrode 345 and the second electrode 350 can be formed using metal, alloy, metal nitride, conductive metal oxide, transparent conductive material, and the like. In some embodiments, a first conductive layer (not illustrated) can be formed on the gate insulation layer 330. The first conductive layer can be patterned by a photolithography process or an etching process using an additional etching mask, thereby forming the gate line 340, the gate electrode 345 and the second electrode 350 on the gate insulation layer 330. In such embodiments, the first conductive layer can be formed on the gate insulation layer 330 by a sputtering process, a chemical vapor deposition process, a pulsed laser deposition (PLD) process, a vacuum evaporation process, an atomic layer deposition (ALD) process, and the like. The gate line 340 and the second electrode 350 can be spaced apart from each other centering the gate electrode 345. The gate line 340 can extend on the gate insulation layer 330 along a first direction, and the gate line 340 can locate apart from the gate electrode 345 by a predetermined distance. In some embodiments, the gate line 340 can be bent at a predetermined angle in a central portion of a pixel region of the display substrate.

The second electrode 350 can be formed on the gate insulation layer 330, such that a storage capacitor including the first electrode 315, the gate insulation layer 330 and the second electrode 350 can be provided on the buffer layer 305. For example, the storage capacitor can include the first electrode 315, a portion of the gate insulation layer 330 and the second electrode 350.

Impurities can be implanted into the semiconductor pattern 310 using the gate electrode 345 as a mask, to form an active pattern 335 of the switching device on the buffer layer 305. For example, the active pattern 335 can include a first impurity region, a channel region and a second impurity region. The active pattern illustrated in FIG. 5 can have a constitution substantially the same as or substantially similar to that of the active pattern 110 described with reference to FIG. 2. For example, the first impurity region and the second impurity region can correspond to a source region and a drain region, respectively. In some embodiments, a conductive type of impurities doped into the semiconductor pattern 310 can vary in accordance with the conductive type of the switching device. For example, when the switching device includes an N type transistor, N type impurities can be doped into the semiconductor pattern 310 to form the first and the second impurity regions. When the switching device includes a P type transistor, P type impurities can be implanted into the semiconductor pattern 310 to form the first and the second impurity regions.

Figure 6:
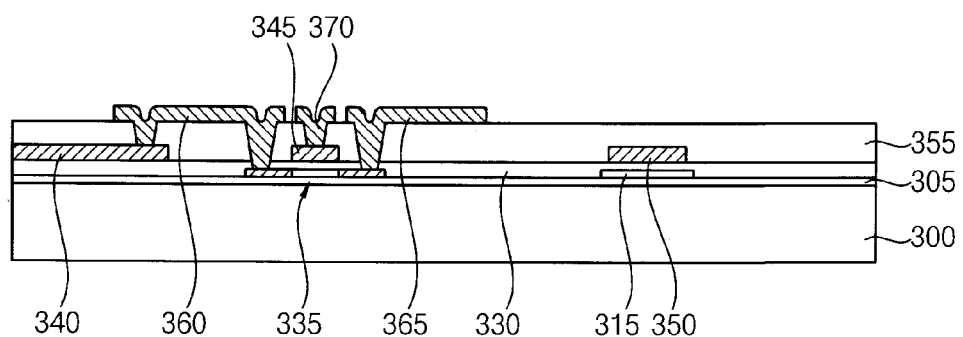

Referring to FIG. 6, a first insulation layer 355 can be formed on the gate insulation layer 330 to cover the gate line 340, the gate electrode 345 and the second electrode 350. The first insulation layer 355 can be formed using silicon oxide, silicon nitride, silicon oxynitride, silicon oxycarbide, silicon carbon nitride, etc. These can be used alone or in a combination thereof. For example, the first insulation layer 355 can have a multi layer structure including a silicon oxide layer and a silicon nitride layer. Further, the first insulation layer 355 can be formed on the gate insulation layer 330 by a spin coating process, a chemical vapor deposition process, a plasma enhanced chemical vapor deposition process, a high density plasma-chemical vapor deposition process, and the like. In some embodiments, the first insulation layer 355 can have a substantially level surface. For example, the first insulation layer 355 can be planarized by a chemical mechanical polishing (CMP) process and/or an etch-back process.

The first insulation layer 355 and the gate insulation layer 330 can be partially removed to form a first contact hole to a fourth contact hole (not illustrated) through the first insulation layer 355. The first to the fourth contact holes can be formed by a photolithography process or an etching process using an additional etching mask. In some embodiments, the first contact hole can be formed through the first insulation layer 355 and the gate insulation layer 330 to partially expose the first impurity region of the active pattern 335. The second contact hole can be formed through the first insulation layer 355 to partially expose the gate line 340. Further, the third contact hole can be formed through the first insulation layer 355 and the gate insulation layer 330 to partially expose the second impurity region of the active pattern 335. The fourth contact hole can be formed through the first insulation layer 355 to partially expose the gate electrode 345.

A source electrode 360, a data line 370 and a drain electrode 365 can be formed on the first insulation layer 355. Each of the source electrode 360, the data line 370 and the drain electrode 365 can be formed using metal, alloy, metal nitride, conductive metal oxide, a transparent conductive material, and the like. In some embodiments, a second conductive layer (not illustrated) can be formed on the first insulation layer 355 to fill the first to the fourth contact holes. The second conductive layer can be patterned to form a first contact to a fourth contact in the first contact hole to the fourth contact hole, respectively. The source electrode 360, the drain electrode 365 and the data line 370 can be simultaneously formed on the first insulation layer 355. For example, the source electrode 360 can be formed simultaneously with the first contact and the second contact, and the drain electrode 365 can be formed simultaneously with the third contact. Additionally, the data line 370 can be formed simultaneously with the fourth contact. The second conductive layer can be formed by a sputtering process, a chemical vapor deposition process, a pulsed laser deposition process, an evaporation process, an atomic layer deposition process, a printing process, and the like. In some embodiments, the source electrode 360, the drain electrode 365 and the data line 370 can be directly formed without forming the first contact to the fourth contact.

As illustrated in FIG. 6, a first portion of the source electrode 360 can be electrically connected to the first impurity region of the active pattern 335 through the first contact, and a second portion of the source electrode 360 can be electrically connected to the gate line 340 through the second contact. For example, the source electrode 360 can extend from over the active pattern 335 to over the gate line 340, and the gate line 340 and the source electrode 360 can be electrically connected to each other through the second contact. The drain electrode 365 can make electrical contact with the second impurity region of the active pattern 335 through the third contact. The drain electrode 365 can extend on the first insulation layer 355 along a direction to the storage capacitor. The data line 370 can be electrically connected to the gate electrode 245 through the fourth contact. The data line 370 can extend along a second direction substantially perpendicular the first direction. The data line 370 can be located adjacent to a bent portion of the gate line 340, and the data line 370 can be located across the pixel region of the display substrate.

The source electrode 360 and the drain electrode 365 can be formed on the first insulation layer 355, so that the switching device including the active pattern 335, the gate insulation layer 330, the gate electrode 345, the source electrode 360 and drain electrode 365 can be provided on the first electrode 300. As for the switching device, the source electrode 360 and the gate electrode 345 can be electrically coupled to the gate line 340 and the data line 370, respectively.

Figure 7:
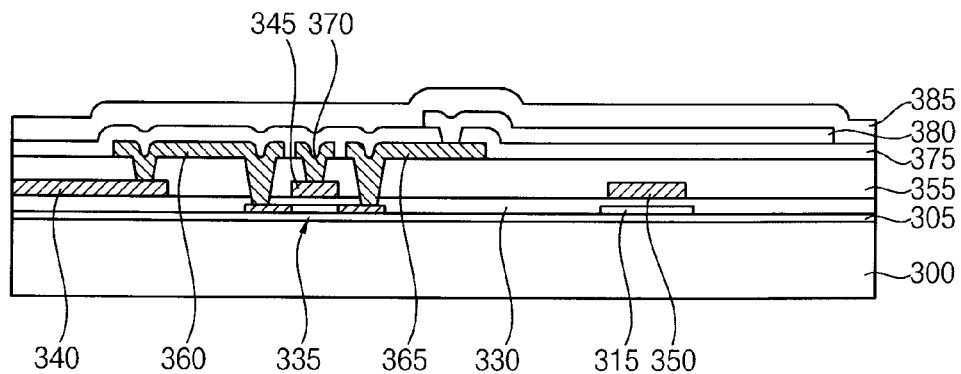

Referring to FIG. 7, a second insulation layer 375 can be formed on the first insulation layer 355 to cover the source electrode 360, the data line 370 and the drain electrode 365. The second insulation layer 375 can be formed using include silicon oxide, silicon nitride, silicon oxynitride, silicon oxycarbide, silicon carbon nitride, and the like. These can be used alone or in a combination thereof. Further, the second insulation layer 375 can be formed on the first insulation layer 355 by a spin coating process, a chemical vapor deposition process, a plasma enhanced chemical vapor deposition process, a high density plasma-chemical vapor deposition process, and the like. In some embodiments, the second insulation layer 375 can be conformally formed on the first insulation layer 355 along profiles of the source electrode 360, the data line 370 and the drain electrode 365. Therefore, the second insulation layer 375 can have stepped portions adjacent to the source electrode 360, the data line 370 and the drain electrode 365.

A pixel electrode 380 can be formed on the second insulation layer 375, and the pixel electrode 380 can be electrically coupled to the drain electrode 365. The pixel electrode 380 can substantially cover the pixel region of the display substrate. The pixel electrode 380 can be formed using a transparent conductive material. In some embodiments, the second insulation layer 375 can be partially removed by a photolithography process or an etching process using an additional etching mask to form a fifth contact hole (not illustrated) which can expose an extending portion of the drain electrode 365. A third conductive layer (not illustrated) can be formed on the second insulation layer 375 to fill the fifth contact hole. In such embodiments, the third conductive layer can be formed on the second insulation layer 375 by a sputtering process, a chemical vapor deposition process, an atomic layer deposition process, a printing process, a vacuum evaporation process, a pulsed laser deposition process, and the like. The third conductive layer can be patterned to form a fifth contact in the fifth contact hole and the pixel electrode 380 on the second insulation layer 375. The pixel electrode 380 can be formed simultaneously with the fifth contact. In some embodiments, the pixel electrode 380 can be directly formed on the drain electrode 365 and the second insulation layer 375 without forming of the fifth contact.

A third insulation layer 385 can be formed on the second insulation layer 375 to cover the pixel electrode 380. The third insulation layer 385 can be formed using silicon compound such as silicon oxide, silicon nitride, silicon oxynitride, silicon oxycarbide, silicon carbon nitride, and the like. These can be used alone or in a combination thereof. Further, the third insulation layer 385 can be formed on the second insulation layer 375 by a spin coating process, a chemical vapor deposition process, a plasma enhanced chemical vapor deposition process, a high density plasma-chemical vapor deposition process, and the like. In some embodiments, the third insulation layer 385 can be formed conformally on the second insulation layer 375 along a profile of the pixel electrode 380. Therefore, the third insulation layer 385 can have stepped portions adjacent to the stepped portions of the pixel electrode 380 and the second insulation layer 375.

A plurality of first common electrodes (not illustrated) and a plurality of second common electrodes (not illustrated) can be formed on the third insulation layer 385. The first and the second common electrodes can be substantially opposed to the pixel electrode 380. Each of the first and the second common electrodes can be formed using a transparent conductive material. In some embodiments, a fourth conductive layer (not illustrated) can be formed on the third insulation layer 385, and then the fourth conductive layer can be patterned to form the first and the second common electrodes on the third insulation layer 385. The fourth conductive layer can be formed on the third insulation layer 385 by a sputtering process, a chemical vapor deposition process, an atomic layer deposition process, a printing process, a vacuum evaporation process, a pulsed laser deposition process, and the like. The first and the second common electrodes can have constitutions substantially the same as or substantially similar to those of the first and the second common electrode 185 and 190 described with reference to FIGS. 1 and 2.

Figure 8:
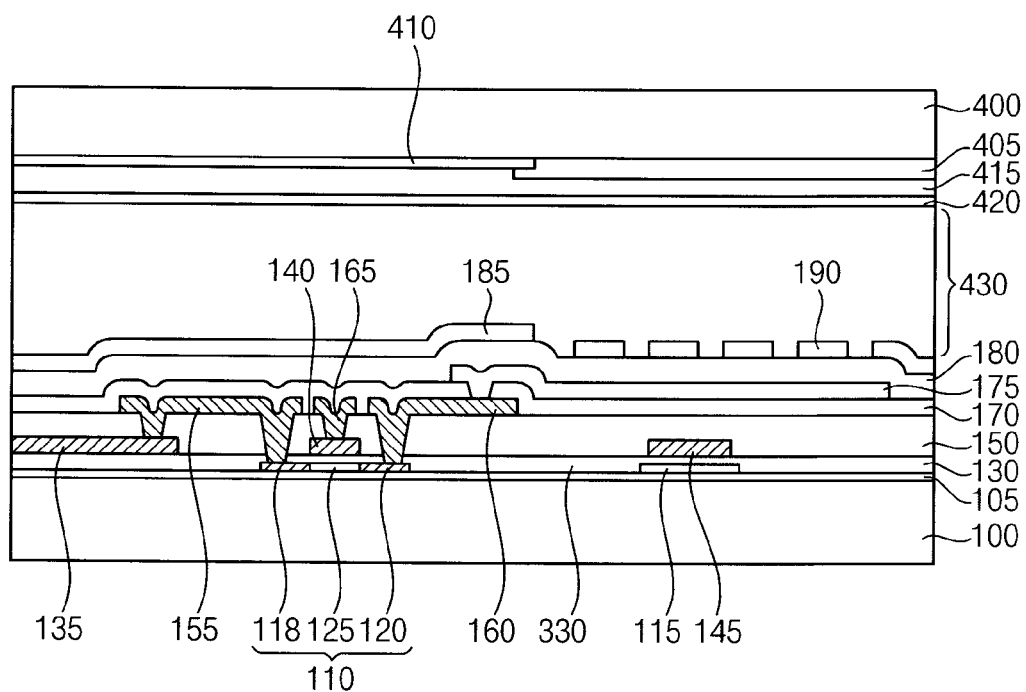
FIG. 8 is a cross sectional view illustrating an embodiment of a liquid crystal display device.

FIG. 8 is a cross sectional view illustrating an embodiment of a liquid crystal display device. The liquid crystal display device illustrated in FIG. 8 can include a display substrate substantially the same as or substantially similar to the display substrate described with reference to FIG. 2, so that detailed descriptions of elements in the display substrate illustrated in FIG. 8 substantially the same as or substantially similar to those of the display substrate in FIG. 2 will be omitted or simplified. Further, the display substrate of the liquid crystal display device illustrated in FIG. 8 can be manufactured by processes substantially the same as or substantially similar to the processes described with reference to FIGS. 4 to 7.

Referring to FIG. 8, the liquid crystal display device can include a display substrate, a liquid crystal layer 430 and a second substrate 400. In some embodiments, the display substrate can include a first substrate 100, a switching device, a gate line 135, a data line 165, a plurality of insulation layers 150, 170 and 180, a pixel electrode 175, first common electrodes 185, second common electrodes 190. Further, a reference electrode 420 substantially corresponding to the first and the second common electrodes 185 and 190 can be disposed on the second substrate 400.

A color filter 405 can be disposed between the second substrate 400 and the reference electrode 420, and a light blocking layer 410 can be disposed between the second substrate 400 and the reference electrode 420 under which the switching device can be disposed. In some embodiments, a plurality of color filters 405 can be disposed on the second substrate 400, a light generated from a light source (not illustrated) through the liquid crystal layer 430 can be filtered into single color of light. For example, the color filters 405 can include red color filters for red color of light, green color filters for green color of light, blue color filters for blue color of light, and so on.

In some embodiments, a first polarizing plate can be disposed under the first substrate 100. The first polarizing plate can have a light axis substantially perpendicular to or substantially parallel to that of the liquid crystal layer 430. Further, a second polarizing plate substantially corresponding to the first polarizing plate can be disposed on the second substrate 400. The second polarizing plate can have a light axis substantially perpendicular to or substantially parallel to that of the liquid crystal layer 430.

An insulation layer 415 covering the color filter 405 and the light blocking layer 410 can be disposed between the reference electrode 420 and the second substrate 400. In some embodiments, the insulation layer 415 may not be provided depending on structures of the color filter 405 and the light blocking layer 410. The liquid crystal layer 430 can include a plurality of liquid crystal molecules, and the reference electrode 420 can include a transparent conductive material. For example, the reference electrode 420 can include zinc oxide, indium tin oxide, tin oxide, indium oxide, gallium oxide, indium zinc oxide, and the like. These can be used alone or in a combination thereof.

In some embodiments, a liquid crystal display device can include a display substrate capable of reducing a coupling capacitance while increasing aperture ratio thereof, so that a brightness, a quality and a display speed of images displayed by the liquid crystal display device can be improved.

In embodiments of a display substrate, a gate line can be electrically connected to a source electrode of a switching device, and a data line can be electrically coupled to a gate electrode of the switching device. Therefore, a coupling capacitance among the first common electrodes, the second common electrodes and the data line in a pixel region of the display substrate can be considerably reduced or prevented to prevent a signal delay of the date line. Further, an aperture ratio of the display substrate can be improved by changing a layout of the data line and the gate line. When a liquid crystal display device includes an embodiment of the display substrate, the liquid crystal display device can ensure an image having an improved brightness, a quality and a display speed.

The foregoing is illustrative of certain embodiments, and is not to be construed as limiting thereof. Although a few embodiments have been described, those skilled in the art will readily appreciate that many modifications are possible in the embodiments without materially departing from the novel teachings and advantages. Accordingly, all such modifications are intended to be included within the scope of embodiments as defined in the claims. In the claims, means-plus-function clauses are intended to cover the structures described herein as performing the recited function, and not only structural equivalents, but also equivalent structures. Therefore, it is to be understood that the foregoing is illustrative of certain embodiments and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A display substrate, comprising:
   a substrate;
   a switching device disposed on the substrate, the switching device comprising:
      an active pattern comprising a first impurity region, a channel region and a second impurity region,
      a gate insulation layer,
      a gate electrode,
      a source electrode, and
      a drain electrode;
   a gate line electrically connected to the source electrode;
   a data line electrically connected to the gate electrode;
   a pixel electrode electrically coupled to the drain electrode; and
   a plurality of common electrodes disposed over the pixel electrode.

2. The display substrate of claim 1, wherein the gate insulation layer covers the active pattern, and the gate line is on the gate insulation layer.

3. The display substrate of claim 2, further comprising an insulation layer disposed on the gate insulation layer, wherein the insulation layer is configured to cover the gate line and the gate electrode.

4. The display substrate of claim 3, wherein the source electrode extends on the insulation layer from the first impurity region to the gate line.

5. The display substrate of claim 4, wherein a first portion of the source electrode is electrically connected to the first impurity region, and a second portion of the source electrode is electrically coupled to the gate line.

6. The display substrate of claim 5, wherein the first portion of the source electrode passes through the insulation layer and the gate insulation layer to make contact with a first contact disposed on the first impurity region, and the second portion of the source electrode passes through the insulation layer to make contact with a second contact on the gate line.

7. The display substrate of claim 6, wherein the source electrode is formed integrally with the first contact and the second contact.

8. The display substrate of claim 3, wherein a first portion of the drain electrode electrically contacts the second impurity region, a second portion of the drain electrode extends on the insulation layer, and the pixel electrode electrically contacts the second portion of the drain electrode.

9. The display substrate of claim 8, wherein the drain electrode passes through the insulation layer and the gate insulation layer to make contact with a third contact disposed on the second impurity region.

10. The display substrate of claim 3, wherein the data line passes through the insulation layer to make contact with a fourth contact disposed on the gate electrode.

11. The display substrate of claim 10, wherein the date line is formed integrally with the fourth contact.

12. The display substrate of claim 1, wherein the switching device is disposed in a central portion of a pixel region of the display substrate, and the data line is disposed adjacent to the central portion of the pixel region.

13. The display substrate of claim 1, wherein the switching device is disposed at peripheral portions of adjacent pixel regions, and the data line is disposed between adjacent pixel regions.

14. The display substrate of claim 1, wherein the common electrodes include a plurality of first common electrodes and a plurality of second common electrodes, the first common electrodes and the second common electrodes separated from one another centered around the switching device.

15. The display substrate of claim 1, wherein distances between the first common electrodes and the second common electrodes are larger than distances between adjacent first common electrodes or adjacent second common electrodes.

16. A method of manufacturing a display substrate, comprising:
   forming an active pattern on a substrate, the active pattern comprising a first impurity region, a channel region and a second impurity region;
   forming a gate insulation layer on the substrate to cover the active pattern;
   forming a gate line and a gate electrode on the gate insulation layer;
   forming a first insulation layer on the gate insulation layer to cover the gate line and the gate electrode;
   forming a source electrode, a data line and a drain electrode on the first insulation layer, the source electrode being electrically connected to the gate line, the data line being electrically connected to the gate electrode, and the drain electrode being electrically connected to the second impurity region;

forming a second insulating layer on the first insulation layer to cover the source electrode, the data line and the drain electrode; and forming a pixel electrode on the second insulation layer, the pixel electrode being electrically connected to the drain electrode.

17. The method of claim 16, wherein forming the source electrode, the data line and the drain electrode comprises:

partially removing the first insulation layer and the gate insulation layer to form a first contact hole exposing the first impurity region, a second contact hole exposing the gate line, a third contact hole exposing the second impurity region, and a fourth contact hole exposing the gate electrode;

forming a first conductive layer on the first insulation layer to fill the first contact hole, the second contact hole, the third contact hole and the fourth contact hole; and patterning the first conductive layer to form a first contact, a second contact, a third contact and a fourth contact in the first contact hole, the second contact hole, the third contact hole and the fourth contact hole, respectively, and to form the source electrode, the data line and the drain electrode on the first insulation layer.

18. The method of claim 17, wherein the source electrode, the first contact and the second contact are formed simultaneously, the drain electrode and the third contact are formed simultaneously, and the data line and the fourth contact are formed simultaneously.

19. The method of claim 16, wherein forming the active pattern further comprises forming a first electrode of a storage capacitor on the gate insulation layer, and forming the gate line and the gate electrode further comprises forming a second electrode of the storage capacitor on the gate insulation layer.

20. The method of claim 16, wherein each of the first and the second insulation layers is formed using a silicon compound.

21. The method of claim 16, wherein forming the pixel electrode comprises:

partially removing the second insulation layer to form a fifth contact hole exposing the drain electrode;

forming a second conductive layer on the second insulation layer to fill the fifth contact hole; and patterning the second conductive layer to form a fifth contact in the fifth contact hole and to form the pixel electrode on the second insulation layer.

22. The method of claim 16, further comprising:

forming a third insulation layer on the second insulation layer to cover the pixel electrode;

forming a plurality of first common electrodes and a plurality of second common electrodes on the third insulation layer, the first and the second common electrodes corresponding to the pixel electrode.

23. A liquid crystal display device comprising:

a first substrate;

a switching device disposed on the first substrate, the switching device comprising an active pattern, a gate insulation layer, a gate electrode, a source electrode and a drain electrode, wherein the active pattern comprises a first impurity region, a channel region and a second impurity region;

a gate line electrically connected to the source electrode;

a data line electrically connected to the gate electrode;

a pixel electrode electrically connected to the drain electrode;

a plurality of common electrodes disposed on the pixel electrode;

a liquid crystal layer disposed on the common electrodes;

a reference electrode disposed on the liquid crystal layer; and a second substrate disposed on the reference electrode.

24. The liquid crystal display device of claim 23, further comprising an insulation layer disposed on the gate insulation layer wherein the insulation layer covers the gate line and the gate electrode.

25. The liquid crystal display device of claim 24, wherein the source electrode on the insulation layer extends from the impurity region to the gate line, a first portion of the source electrode is electrically connected to the first impurity region, and a second portion of the source electrode is electrically connected to the gate line.

26. The liquid crystal display device of claim 25, wherein the first portion of the source electrode passes through the insulation layer and the gate insulation layer to make contact with a first contact disposed on the first impurity region, the second portion of the source electrode passes through the insulation layer to make contact with a second contact disposed on the gate line, and the data line passes through the insulation layer to make contact with a fourth contact disposed on the gate electrode.

27. The liquid crystal display device of claim 23, wherein the switching device is disposed in a central portion of a pixel region or peripheral portions of adjacent pixel regions, and the data line is disposed adjacent to the central portion of the pixel region or between adjacent pixel regions.

* * * * *